United States Patent
Masui et al.

(10) Patent No.: US 9,446,484 B2
(45) Date of Patent: Sep. 20, 2016

(54) CONDUCTIVE PARTICLES, METHOD FOR PRODUCING CONDUCTIVE PARTICLES, CONDUCTIVE MATERIAL AND CONNECTION STRUCTURE

(71) Applicant: SEKISUI CHEMICAL CO., LTD., Osaka, Osaka (JP)

(72) Inventors: Ryohei Masui, Osaka (JP); Takashi Kubota, Osaka (JP); Hideaki Ishizawa, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/379,489

(22) PCT Filed: Feb. 19, 2013

(86) PCT No.: PCT/JP2013/053974
§ 371 (c)(1),
(2) Date: Aug. 18, 2014

(87) PCT Pub. No.: WO2013/125517
PCT Pub. Date: Aug. 29, 2013

(65) Prior Publication Data
US 2015/0008022 A1    Jan. 8, 2015

(30) Foreign Application Priority Data
Feb. 21, 2012  (JP) .................. 2012-034932

(51) Int. Cl.
| | |
|---|---|
| *B23K 35/02* | (2006.01) |
| *B23K 35/36* | (2006.01) |
| *H05K 1/02* | (2006.01) |
| *H05K 1/03* | (2006.01) |
| *H05K 1/09* | (2006.01) |
| *H05K 1/11* | (2006.01) |

(Continued)

(52) U.S. Cl.
CPC ......... *B23K 35/0244* (2013.01); *B23K 35/365* (2013.01); *B23K 35/3612* (2013.01);

(Continued)

(58) Field of Classification Search
CPC ......... B23K 35/0244; B23K 35/3612; B23K 35/3618; B23K 35/365; H01B 1/22; H01R 4/04; H01R 12/52; H05K 1/0213; H05K 1/0393; H05K 1/095; H05K 1/118; H05K 2201/0323; H05K 2201/0784
USPC ........................................................ 174/257
See application file for complete search history.

(56) References Cited

U.S. PATENT DOCUMENTS

2010/0133486 A1    6/2010 Takai et al.

FOREIGN PATENT DOCUMENTS

| | | |
|---|---|---|
| CN | 1706008 A | 12/2005 |
| CN | 101523513 A | 9/2009 |

(Continued)

OTHER PUBLICATIONS

Written Opinion of the international Searching Authority (PCT/ISA/237) for Application No. PCT/JP2013/053974 mailed Apr. 2, 2013. (English Translation mailed Sep. 4, 2014).

(Continued)

*Primary Examiner* — Timothy Thompson
*Assistant Examiner* — Paul McGee, III
(74) *Attorney, Agent, or Firm* — Cheng Law Group, PLLC

(57) ABSTRACT

Provided are a conductive particle and a conductive material which are capable of decreasing the connection resistance and suppressing generation of voids in a connection structure when the connection structure is obtained by electrically connecting electrodes. The conductive particle according to the present invention has a solder at a conductive surface, wherein a group including a carboxyl group is covalently bonded to the surface of the solder; and the conductive material according to the present invention includes the conductive particles and a binder resin.

10 Claims, 3 Drawing Sheets

(51) Int. Cl.
*H01B 1/22* (2006.01)
*H01R 4/04* (2006.01)
*B23K 35/365* (2006.01)
*H01R 12/52* (2011.01)

(52) U.S. Cl.
CPC ............ *B23K35/3618* (2013.01); *H01B 1/22* (2013.01); *H01R 4/04* (2013.01); *H05K 1/0213* (2013.01); *H05K 1/0393* (2013.01); *H05K 1/095* (2013.01); *H05K 1/118* (2013.01); *H01R 12/52* (2013.01); *H05K 2201/0323* (2013.01); *H05K 2201/0784* (2013.01)

(56) References Cited

FOREIGN PATENT DOCUMENTS

| | | | | |
|---|---|---|---|---|
| JP | 2004-179137 A | | 6/2004 | |
| JP | CN 1706008 A | * | 12/2005 | ................ C09J 7/00 |
| JP | 2008-272779 A | | 11/2008 | |
| JP | 2009-102731 A | | 5/2009 | |
| JP | 2009102731 A | * | 5/2009 | |
| JP | 2009-170414 A | | 7/2009 | |
| JP | 2010-126719 A | | 6/2010 | |
| JP | 2011-9184 A | | 1/2011 | |
| JP | 2011-63727 A | | 3/2011 | |
| JP | 2011-219869 A | | 11/2011 | |
| WO | WO-2009/001448 A1 | | 12/2008 | |

OTHER PUBLICATIONS

International Search Report for the Application No. PCT/JP2013/053974 mailed Apr. 2, 2013.
Written Opinion of the International Searching Authority (PCT/ISA/237) for Application No. PCT/JP2013/053974 mailed Apr. 2, 2013.
The First Office Action for the Application No. 201380000844.X from the State Intellectual Property Office of the People's Republic of China dated Apr. 9, 2014.

* cited by examiner

CONDUCTIVE PARTICLES, METHOD FOR PRODUCING CONDUCTIVE PARTICLES, CONDUCTIVE MATERIAL AND CONNECTION STRUCTURE

TECHNICAL FIELD

The present invention relates to conductive particles each having a solder at a conductive surface, and relates to, for example, conductive particles which can be used for electrically connecting electrodes of various connection object members such as a flexible printed circuit board, a glass board, a glass epoxy board and a semiconductor chip, and a method for producing conductive particles. The present invention also relates to a conductive material and a connection structure each using the conductive particles.

BACKGROUND ART

Paste-like and film-like anisotropic conductive materials are widely known. In the anisotropic conductive material, a plurality of conductive particles are dispersed in a binder resin.

The anisotropic conductive material is used for, for example, connection of a flexible printed circuit board and a glass board (FOG (Film on Glass)), connection of a semiconductor chip and a flexible printed circuit board (COF (Chip on Film)), connection of a semiconductor chip and a glass board (COG (Chip on Glass)), connection of a flexible printed circuit board and a glass epoxy board (FOB (Film on Board)) and so on in order to obtain various kinds of connection structures.

For example, when an electrode of a semiconductor chip and an electrode of a glass board are electrically connected by the anisotropic conductive material, an anisotropic conductive material including conductive particles is arranged on the glass board. Next, the semiconductor chip is laminated, and the laminate is heated and pressurized. The anisotropic conductive material is thereby cured, so that the electrodes are electrically connected via conductive particles to obtain a connection structure.

As one example of the anisotropic conductive material, Patent Documents 1 and 2 disclose an anisotropic conductive material including a thermosetting binder, solder particles having a melting point of 180° C. or lower or 160° C. or lower, and a flux component. As the flux component, a compound represented by the following formula (101) or (102) is used. The anisotropic conductive material described in Patent Document 1 essentially includes an epoxy resin and a cationic curing initiator as the thermosetting binder. Patent Documents 1 and 2 describe that a flux component and a solder particle are chelate-coordinated.

[Formula 1]

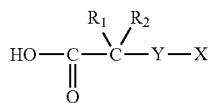

Formula (101)

[Formula 2]

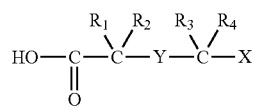

Formula (102)

In the formula (101) and the formula (102), $R_1$ to $R_4$ each represent a hydrogen atom, an alkyl group or a hydroxyl group; X represents an atomic group having a lone electron-pair or a double bond π electron with which a metal can be coordinated; and Y represents an atom or an atomic group that forms a main chain backbone. In Patent Document 2, Y in the formula (101) and the formula (102) represents an alkyl group.

Patent Document 3 discloses a solder ball coated on the surface with at least two organic acids having 10 to 25 carbon atoms and having a carboxyl group. In the solder ball, the carboxyl group of the organic acid is chelate-coordinated with the surface of the solder ball.

Patent Document 4 discloses a solder powder coated by chemically bonding at least one of a fatty acid and a dicarboxylic acid to the surface. Patent Document 4 discloses a conductive adhesive (anisotropic conductive material) including the solder powder, a resin and a curing agent.

RELATED ART DOCUMENT

Patent Document

Patent Document 1: JP 2011-63727 A
Patent Document 2: WO 2009/001448 A1
Patent Document 3: JP 2008-272779 A
Patent Document 4: JP 2010-126719 A

SUMMARY OF THE INVENTION

Problem to be Solved by the Invention

In Patent Documents 1 and 2, the compound represented by the formula (101) or (102) is used as a component having a flux effect. In Patent Documents 1 and 2, however, the compound represented by the formula (101) or (102) is merely used as a component different from the solder particle.

When the connection structure is obtained using a conventional anisotropic conductive material as described in Patent Document 1 or 2, voids may be generated in a cured product of the anisotropic conductive material in the obtained connection structure. Therefore, there is the problem of low connection reliability in the connection structure or high connection resistance between electrodes.

Patent Documents 1 and 2 describe that a flux component and a solder particle are chelate-coordinated. However, when the flux component and the solder particle are merely coordinately bonded so as to be chelate-coordinated with each other, the flux component is easily detached from the surface of solder particle. When the flux component and the solder particle are merely coordinately bonded, the connection resistance between electrodes may increase, or generation of voids may not be sufficiently suppressed.

Even if the solder ball described in Patent Document 3 is used, an organic acid is easily detached from the surface of the solder ball, and the connection resistance between electrodes may increase, or generation of voids may not be sufficiently suppressed.

In Patent Document 4, at least one of a fatty acid and a dicarboxylic acid is chemically bonded to the surface. In Patent Document 4, a reaction is carried out at 40 to 60° C. with use of no catalyst in order to obtain a solder powder. Therefore, the fatty acid and the dicarboxylic acid are not covalently bonded to the surface of the solder powder. Even if the solder powder described in Patent Document 4 is used, the fatty acid or the dicarboxylic acid is easily detached from the surface of the solder powder, and the connection resistance between electrodes may increase, or generation of voids may not be sufficiently suppressed.

Therefore, when the connection structure is obtained using conventional conductive particles each having a solder at a surface, the connection resistance between electrodes tends to increase in the obtained connection structure.

An object of the present invention is to provide conductive particles capable of decreasing the connection resistance in a connection structure when the connection structure is obtained by electrically connecting electrodes, and suppressing generation of voids, and a method for producing the conductive particles, as well as a conductive material and a connection structure each using the conductive particles.

Means for Solving the Problem

According to a broad aspect of the present invention, there is provided a conductive particle having a solder at a conductive surface, wherein a group including a carboxyl group is covalently bonded to the surface of the solder.

In a specific aspect of the conductive particle according to the present invention, the group including a carboxyl group is covalently bonded to the surface of the solder via an ether bond. Ina specific aspect of the conductive particle according to the present invention, the group including a carboxyl group is covalently bonded to the surface of the solder via an ester bond.

In another specific aspect of the conductive particle according to the present invention, the conductive particle is obtained by using a compound having a functional group capable of reacting with a hydroxyl group and having a carboxyl group and by allowing a hydroxyl group on the surface of the solder to react with the functional group capable of reacting with a hydroxyl group.

In still another specific aspect of the conductive particle according to the present invention, the functional group capable of reacting with a hydroxyl group is a hydroxyl group or a carboxyl group, and when the functional group capable of reacting with a hydroxyl group is a carboxyl group, the compound has at least two carboxyl groups.

In another specific aspect of the conductive particle according to the present invention, the conductive particle includes a base particle and a solder layer arranged on the surface of the base particle, and has the solder derived from the solder layer at the conductive surface.

In still another specific aspect of the conductive particle according to the present invention, the conductive particle further includes a first conductive layer arranged between the base particle and the solder layer, and the solder layer is arranged on the outer surface of the first conductive layer.

The conductive particle according to the present invention is dispersed in a binder resin, and suitably used as a conductive material.

According to a broad aspect of the present invention, there is provided a method for producing conductive particles, including a step of using conductive particles each having a solder at a conductive surface and mixing the conductive particles, a compound having a functional group capable of reacting with a hydroxyl group and having a carboxyl group, a catalyst and a solvent to form conductive particles in which a group including a carboxyl group is covalently bonded to the surface of the solder.

In a specific aspect of the method for producing conductive particles according to the present invention, conductive particles each having a solder at a conductive surface are used, and the conductive particles, the compound having a functional group capable of reacting with a hydroxyl group and having a carboxyl group, the catalyst and the solvent are mixed and heated.

The conductive material according to the present invention includes the conductive particle and a binder. In a specific aspect of the conductive material according to the present invention, the conductive material is an anisotropic conductive material, and the content of the conductive particles in 100% by weight of the anisotropic conductive material is not less than 1% by weight and not more than 50% by weight.

The connection structure according to the present invention includes: a first connection object member having a first electrode on a surface; a second connection object member having a second electrode on a surface; and a connection part connecting the first connection object member and the second connection object member, wherein the connection part is formed of the conductive particles or formed of the conductive material including the conductive particles and a binder resin, and the first electrode and the second electrode are electrically connected by the conductive particles.

Effect of the Invention

A conductive particle according to the present invention has a solder at a conductive surface, and a group including a carboxyl group is covalently bonded to the surface of the solder, so that when a connection structure is obtained by electrically connecting electrodes using the conductive particle according to the present invention, the connection resistance can be decreased and generation of voids can be suppressed in the obtained connection structure.

MODE FOR CARRYING OUT THE INVENTION

Figure 1:
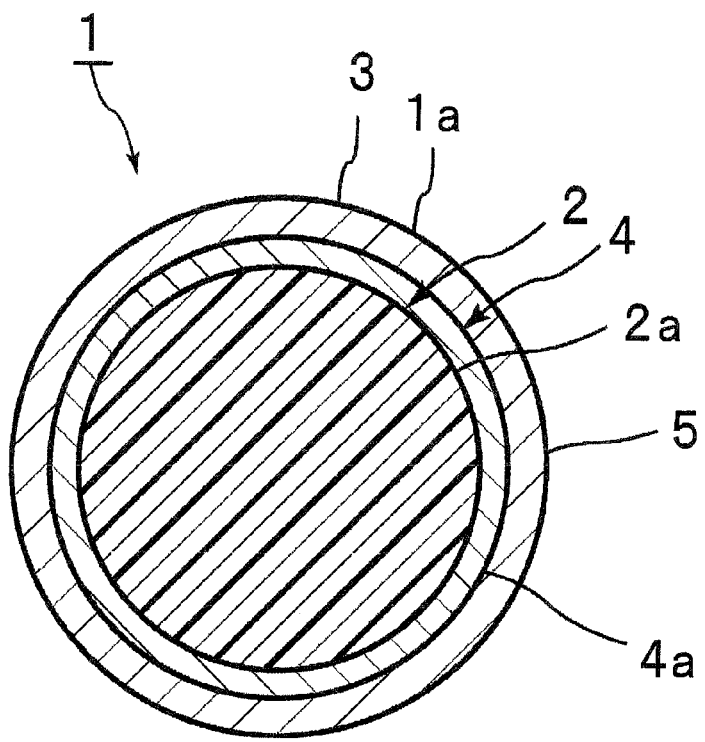
FIG. 1 is a sectional view schematically showing a conductive particle according to a first embodiment of the present invention.

Details of the present invention will be described below.

The conductive particle according to the present invention has a solder at a conductive surface. In the conductive particle according to the present invention, a group including a carboxyl group is covalently bonded to the surface of the solder. The conductive particle according to the present invention is different from a particle in which a conductive particle having a solder on a surface is merely coated with a compound having a carboxyl group. In the conductive particle according to the present invention, not only a carboxyl group is present on the surface of the solder, but also the group including a carboxyl group is covalently bonded to the surface of the solder. The conductive particle according to the present invention is also different from a conductive particle in which a compound having a carboxyl group is chelate-coordinated (coordinately bonded) to the surface of a solder.

The conductive particle according to the present invention has a solder at a conductive surface, and a group including a carboxyl group is covalently bonded to the surface of the solder, so that when a connection structure is obtained by electrically connecting electrodes using the conductive particle according to the present invention, the connection resistance between electrodes can be further decreased. The conductive particle according to the present invention has a solder at a conductive surface, and a group including a carboxyl group is covalently bonded to the surface of the solder, so that when a connection structure is obtained by electrically connecting electrodes using the conductive particle according to the present invention, generation of voids can be suppressed in the obtained connection structure. As a result of being able to suppress the generation of voids, connection reliability in the connection structure is enhanced. Further, an increase in connection resistance in the connection structure, which is caused by voids, can be suppressed. An oxide film is hard to be formed on the surface of the solder, and further an oxide film on the surface of an electrode can be effectively eliminated during connection of electrodes.

Preferably, before a conductive particle is dispersed in a binder resin, a group including a carboxyl group is covalently bonded to the surface of a solder in the conductive particle. Preferably, a conductive particle in which a group including a carboxyl group is covalently bonded to the surface of a solder is dispersed in a binder resin and a conductive material is obtained. Before a conductive particle is dispersed in a binder resin, when a group including a carboxyl group is covalently bonded to the surface of a solder in the conductive particle, oxide films on the surface of a solder and the surface of an electrode can be effectively eliminated even if a flux is not blended in the conductive material or the amount of a flux added in the conductive material is small. When a flux is not blended, or the use amount of a flux is decreased, generation of voids can be further suppressed in the connection structure.

The conductive particle according to the present invention is dispersed in a binder resin, and suitably used as a conductive material. The conductive material may be a conductive material capable of being cured by both light irradiation and heating. In this case, the conductive material can be semi-cured (B-stage) by light irradiation to reduce fluidity of the conductive material, followed by curing the conductive material by heating. Two thermal curing agents different in reaction temperature may also be used. When two thermal curing agents different in reaction temperature are used, the conductive material can be semi-cured by heating, and further the conductive material semi-cured by heating can be cured.

First, the conductive particle according to the present invention will be described in detail below. Further, components contained or preferably contained in the conductive material will be described below.

[Conductive Particle]

The conductive particle has a solder at a conductive surface. In the conductive particle, a group including a carboxyl group is covalently bonded to the surface of the solder. Preferably, the group including a carboxyl group is covalently bonded to the surface of the solder via an ether bond for effectively decreasing the connection resistance and effectively suppressing generation of voids in the connection structure. Preferably, the group including a carboxyl group is covalently bonded to the surface of the solder via an ester bond for effectively decreasing the connection resistance and effectively suppressing generation of voids in the connection structure.

The present inventors have paid attention to the presence of a hydroxyl group on the surface of the solder, and found that by covalently bonding the hydroxyl group and the group including a carboxyl group, a stronger bond can be formed as compared to bonds formed by other coordinate bonds (chelate coordination) etc., so that a conductive particle capable of decreasing the connection resistance between electrodes and suppressing generation of voids is obtained.

The conductive particle according to the present invention may not have either a coordinate bond or a bond by chelate coordination as a bonding form between the surface of the solder and the group including a carboxyl group.

Preferably, the conductive particle is obtained by using a compound having a functional group capable of reacting with a hydroxyl group and having a carboxyl group (hereinafter, may be referred to as a compound X) and by reacting a hydroxyl group on the surface of the solder with the functional group capable of reacting with a hydroxyl group for effectively decreasing the connection resistance and effectively suppressing generation of voids in the connection structure. In the reaction, a covalent bond is formed. When the hydroxyl group on the surface of the solder and the functional group capable of reacting with a hydroxyl group in the compound X are reacted with each other, a conductive particle in which the group including a carboxyl group is covalently bonded to the surface of the solder can be easily obtained, a conductive particle in which the group including a carboxyl group is covalently bonded to the surface of the solder via an ether bond can be also easily obtained, and a conductive particle in which the group including a carboxyl group is covalently bonded to the surface of the solder via an ester bond can be also easily obtained. When the functional group capable of reacting with a hydroxyl group is reacted with the hydroxyl group on the surface of the solder, the compound X can be chemically bonded to the surface of the solder in the form of a covalent bond.

Examples of the functional group capable of reacting with a hydroxyl group include a hydroxyl group, a carboxyl group, an ester group and a carbonyl group. Among them, a hydroxyl group or a carboxyl group is preferred. The functional group capable of reacting with a hydroxyl group may be a hydroxyl group, or may be a carboxyl group.

Examples of the compound having a functional group capable of reacting with a hydroxyl group include levulinic acid, glutaric acid, succinic acid, malic acid, oxalic acid, malonic acid, adipic acid, 5-ketohexanoic acid, 3-hydroxypropionic acid, 4-aminobutyric acid, 3-mercaptopropionic acid, 3-mercaptoisobutyric acid, 3-methylthiopropionic acid, 3-phenylpropionic acid, 3-phenylisobutyric acid, 4-phenylbutyric acid, decanoic acid, dodecanoic acid, tetradecanoic acid, pentadecanoic acid, hexadecanoic acid, 9-hexadecenoic acid, heptadecanoic acid, stearic acid, oleic acid, vaccenic acid, linoleic acid, (9,12,15)-linolenic acid, nonadecanoic acid, arachidic acid, decanedioic acid and dodecanedioic acid. Among them, glutaric acid or glycolic acid is preferred. The compounds having a functional group capable of reacting with a hydroxyl group may be used alone, or used in combination of two or more thereof.

The compound X preferably has a flux effect, and the compound X preferably has a flux effect while being bonded to the surface of the solder. The compound having a flux effect is capable of removing an oxide film on the surface of the solder and an oxide film on the surface of an electrode. The carboxyl group has a flux effect.

Examples of the compound having a flux effect include levulinic acid, glutaric acid, succinic acid, 5-ketohexanoic acid, 3-hydroxypropionic acid, 4-aminobutyric acid, 3-mercaptopropionic acid, 3-mercaptoisobutyric acid, 3-methylthiopropionic acid, 3-phenylpropionic acid, 3-phenylisobutyric acid and 4-phenylbutyric acid. Among them, glutaric acid or glycolic acid is preferred. The compounds having a flux effect may be used alone, or used in combination of two or more thereof.

The functional group capable of reacting with a hydroxyl group in the compound X is preferably a hydroxyl group or a carboxyl group for effectively decreasing the connection resistance and effectively suppressing generation of voids in the connection structure. The functional group capable of reacting with a hydroxyl group in the compound X may be a hydroxyl group, or may be a carboxyl group. When the functional group capable of reacting with a hydroxyl group is a carboxyl group, the compound X preferably has at least two carboxyl groups. When any of the carboxyl groups of the compound having at least two carboxyl groups is reacted with the hydroxyl group on the surface of the solder, a conductive particle in which the group including a carboxyl group is covalently bonded to the surface of the solder is obtained.

The compound X is preferably a compound represented by the following formula (1) for effectively decreasing the connection resistance and effectively suppressing generation of voids in the connection structure. The compound represented by the following formula (1) has a flux effect. The compound represented by the following formula (1) has a flux effect while being bonded to the surface of the solder.

[Formula 3]

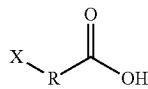

Formula (1)

In the formula (1), X represents a functional group capable of reacting with a hydroxyl group, and R represents a divalent organic group having 1 to 5 carbon atoms. The organic group may contain a carbon atom, a hydrogen atom and an oxygen atom. The organic group may be a divalent hydrocarbon group having 1 to 5 carbon atoms. The main chain of the organic group is preferably a divalent hydrocarbon group. In the organic group, a carboxyl group or a hydroxyl group may be bonded to the divalent hydrocarbon group. The compound represented by the formula (1) includes, for example, citric acid.

The compound X is preferably a compound represented by the following formula (1A) or the following formula (1B). The compound X is preferably a compound represented by the following formula (1A), or a compound represented by the following formula (1B).

[Formula 4]

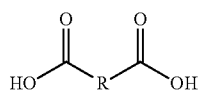

Formula (1A)

In the formula (1A), R represents a divalent organic group having 1 to 5 carbon atoms. R in the formula (1A) is the same as R in the formula (1).

[Formula 5]

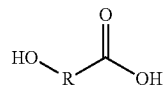

Formula (1B)

In the formula (1B), R represents a divalent organic group having 1 to 5 carbon atoms. R in the formula (1B) is the same as R in the formula (1).

Preferably, a group represented by the following formula (2A) or the following formula (2B) is bonded to the surface of the solder. Preferably, a group represented by the following formula (2A), and more preferably a group represented by the following formula (2B) is bonded to the surface of the solder.

[Formula 6]

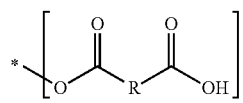

Formula (2A)

In the formula (2A), R represents a divalent organic group having 1 to 5 carbon atoms. R in the formula (2A) is the same as R in the formula (1).

[Formula 7]

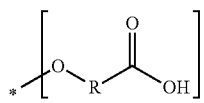

Formula (2B)

In the formula (2B), R represents a divalent organic group having 1 to 5 carbon atoms. R in the formula (2B) is the same as R in the formula (1).

For enhancing the wettability of the surface of the solder, the compound X preferably has a molecular weight of 10000 or less, more preferably 1000 or less, and further preferably 500 or less.

When the compound X is not a polymer and when a structural formula of the compound X can be identified, the molecular weight means a molecular weight that can be calculated from the structural formula. When the compound X is a polymer, the molecular weight means a weight average molecular weight.

A method for producing conductive particles according to the present invention includes a step of using conductive particles each having a solder at a conductive surface and mixing the conductive particles, a compound having a functional group capable of reacting with a hydroxyl group and having a carboxyl group, a catalyst and a solvent. In the method for producing conductive particles according to the present invention, conductive particles in which a group including a carboxyl group is covalently bonded to the surface of the solder are obtained. In the method for producing conductive particles according to the present invention, conductive particles in which a group including a carboxyl group is covalently bonded to the surface of the solder can be easily obtained through the above-described mixing step.

In the method for producing conductive particles according to the present invention, it is preferred that conductive particles each having a solder at a conductive surface are used, and the conductive particles, the compound having a functional group capable of reacting with a hydroxyl group and having a carboxyl group, the catalyst and the solvent are mixed and heated. Conductive particles in which a group including a carboxyl group is covalently bonded to the surface of the solder can be further easily obtained through the mixing and heating step.

Examples of the solvent include alcohol solvents such as methanol, ethanol, propanol and butanol, acetone, methyl ethyl ketone, ethyl acetate, toluene and xylene. The solvent is preferably an organic solvent, and more preferably toluene. The solvents may be used alone, or used in combination of two or more thereof.

Examples of the catalyst include p-toluenesulfonic acid, benzenesulfonic acid and 10-camphorsulfonic acid. The catalyst is preferably p-toluenesulfonic acid. The catalysts may be used alone, or used in combination of two or more thereof.

Preferably, heating is performed during the mixing. The heating temperature is preferably 90° C. or higher, more preferably 100° C. or higher, and preferably 130° C. or lower, more preferably 110° C. or lower.

The conductive particle may be a solder particle, or may be a conductive particle including a base particle and a solder layer arranged on the surface of the base particle. The solder particle does not have a base particle as a core, and is not a core-shell particle. The solder particle is formed of a solder at both the central part and the outer surface.

Preferably, the conductive particle includes a base particle and a solder layer arranged on the surface of the base particle. The conductive particle may include a conductive layer (first conductive layer) other than the solder layer between the base particle and the solder layer. The solder layer may be arranged on the surface of the base particle with a conductive layer other than the solder layer interposed therebetween. The solder layer may be arranged on the surface of a conductive layer other than the solder layer. For further enhancing thermal shock resistance in the connection structure, the base particle is preferably a resin particle. The base particle is preferably a metallic particle having a melting point of 400° C. or higher or a resin particle having a softening point of 260° C. or higher. The softening point of the resin particle is preferably higher than the softening point of the solder layer, and more preferably higher than the softening point of the solder layer by 10° C. or more.

Examples of the base particle include resin particles, inorganic particle other than metallic particles, organic-inorganic hybrid particles and metallic particles. The base particle is not preferably a metallic particle, is more preferably a resin particle or an organic-inorganic hybrid particle, and further preferably a resin particle. The resin particle is formed of a resin. The base particle may be a metallic particle having a melting point of lower than 400° C., or may be a metallic particle having a melting point of 400° C. or higher, or may be a resin particle having a softening point of lower than 260° C., or may be a resin particle having a softening point of 260° C. or higher.

The conductive particle according to a first embodiment of the present invention is shown in FIG. 1 as a sectional view.

A conductive particle 1 shown in FIG. 1 includes a resin particle 2 (base particle) and a conductive layer 3 arranged on a surface 2a of the resin particle 2. The conductive layer 3 covers the surface 2a of the resin particle 2. The conductive particle 1 is a coated particle which has the surface 2a of the resin particle 2 coated with the conductive layer 3. Therefore, the conductive particle 1 has the conductive layer 3 at a surface 1a. A metallic particle or the like may be used in place of the resin particle 2.

The conductive layer 3 includes a first conductive layer 4 arranged on the surface 2a of the resin particle 2, and a solder layer 5 (second conductive layer) arranged on an outer surface 4a of the first conductive layer 4. The first conductive layer 4 is arranged between the resin particle 2 (base particle) and the solder layer 5. The outer surface layer of the conductive layer 3 is the solder layer 5. The conductive particle 1 has a solder derived from the solder layer 5 on the surface of the conductive layer 3. Therefore, the conductive particle 1 has the solder layer 5 as a part of the conductive layer 3, and further has the first conductive layer 4 as a part of the conductive layer 3 and as a layer different from the solder layer 5 between the resin particle 2 and the solder layer 5. Thus, the conductive layer 3 may have a multilayer structure or may have a laminated structure of two or more layers.

Figure 2:
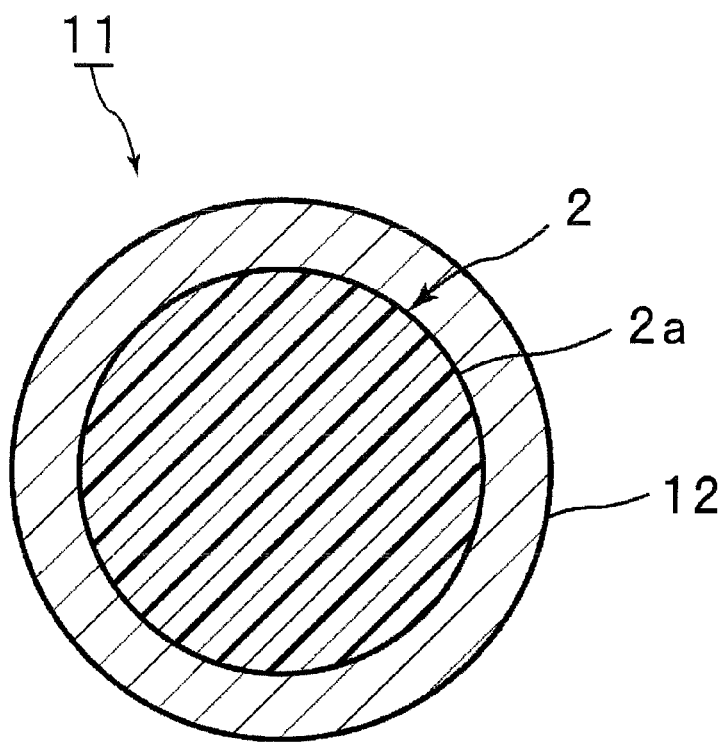
FIG. 2 is a sectional view schematically showing a conductive particle according to a second embodiment of the present invention.

The conductive particle according to a second embodiment of the present invention is shown in FIG. 2 as a sectional view.

As described above, in the conductive particle 1 shown in FIG. 1, the conductive layer 3 has a two-layer structure. As shown in FIG. 2, a conductive particle 11 may have a solder layer 12 as a single-layer conductive layer. At least the surface (outer surface layer) of a conductive part (conductive layer) in the conductive particle should be a solder (solder layer). However, among the conductive particle 1 and the conductive particle 11, the conductive particle 1 is preferable because preparation of a conductive particle is easy.

Figure 3:
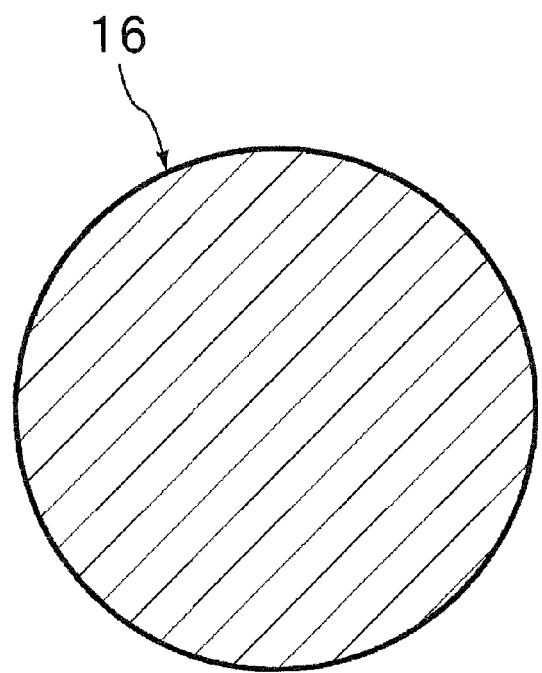
FIG. 3 is a sectional view schematically showing a conductive particle according to a third embodiment of the present invention.

The conductive particle according to a third embodiment of the present invention is shown in FIG. 3 as a sectional view.

As shown in FIG. 3, a conductive particle 16 that is a solder particle which does not have a base particle as a core and is not a core-shell particle may be used.

The conductive particles 1, 11 and 16 are the conductive particles according to the present invention, and can be used for the conductive material according to the present invention. Among the conductive particles 1, 11 and 16, the conductive particles 1 and 11 are preferred, and the conductive particle 1 is more preferred.

Examples of the resin for forming the resin particle described above include polyolefin resins, acrylic resins, phenol resins, melamine resins, benzoguanamine resins, urea resins, epoxy resins, unsaturated polyester resins, saturated polyester resins, polyethylene terephthalate, polysulfone, polyphenylene oxide, polyacetal, polyimide, polyamide imide, polyether ether ketone, polyether sulfone, divinylbenzene polymers and divinylbenzene-based copolymers. Examples of the divinylbenzene-based copolymer include divinylbenzene-styrene copolymers and divinylbenzene-(meth)acrylic acid ester copolymers. The resin for forming the resin particle described above is preferably a polymer obtained by polymerizing one or more polymerizable monomers having an ethylenically unsaturated group because the hardness of the resin particle can be easily controlled to a preferred range.

The method for forming a conductive layer on the surface of the resin particle and the method for forming a solder layer on the surface of the resin particle or on the surface of the first conductive layer are not particularly limited. Examples of the method for forming the conductive layer and the solder layer include a method by electroless plating, a method by electroplating, a method by physical collision, a method by a mechanochemical reaction, a method by physical vapor deposition or physical adsorption, and a method in which the surface of a resin particle is coated with a metallic powder or a paste containing a metallic powder and a binder. Particularly, a method by electroless plating, electroplating or physical collision is preferred. Examples of the method by physical vapor deposition include methods of vacuum deposition, ion plating, ion sputtering and the like. In the method by physical collision, for example, Theta Composer (manufacture by TOKUJU Co., LTD) or the like is used.

The method for forming the solder layer is preferably a method by physical collision. Preferably, the solder layer is arranged on the surface of the base particle by physical collision.

The material for forming the solder (solder layer) is preferably a filler material having a liquidus line of 450° C. or lower in accordance with JIS Z3001: Welding Terminology. Examples of the composition of the solder include metallic compositions including zinc, gold, silver, lead, copper, tin, bismuth and indium. Particularly, a low-melting and lead-free tin-indium-based (eutectic 117° C.) or tin-bismuth-based (eutectic 139° C.) solder is preferable. That is, preferably the solder does not contain lead, and is preferably a solder containing tin and indium or a solder containing tin and bismuth.

The content of tin in 100% by weight of the solder (solder layer) is preferably less than 90% by weight, more preferably 85% by weight or less. The content of tin in 100% by weight of the solder is appropriately determined in consideration of the melting point of the solder and so on. The content of tin in 100% by weight of the solder is preferably 5% by weight or more, more preferably 10% by weight or more, further preferably 20% by weight or more.

The thickness of each of the first conductive layer and the solder layer is preferably 0.5 μm or more, more preferably 1 μM or more, further preferably 2 μm or more, and preferably 20 μm or less, more preferably 10 μm or less, further preferably 6 μm or less. When the thickness of each of the first conductive layer and the solder layer is not less than the above-mentioned lower limit, conductivity is sufficiently high. When the thickness of each of the first conductive layer and the solder layer is not more than the above-mentioned upper limit, a difference in thermal expansion coefficient between the base particle and the first conductive layer and solder layer becomes small, so that peeling of the first conductive layer and solder layer is hard to occur.

The average particle diameter of the conductive particles is preferably 0.1 μm or more, more preferably 1 μm or more, and preferably 500 μm or less, more preferably 100 μm or less, further preferably 80 μm or less, especially preferably 50 μm or less, most preferably 40 μm or less. When the average particle diameter of the conductive particles is not less than the above-mentioned lower limit and not more than the above-mentioned upper limit, the contact area of the conductive particle and the electrode becomes sufficiently large, and aggregated conductive particles are hard to be formed in formation of the conductive layer. The gap between electrodes connected through the conductive particles does not become excessively large, and the conductive layer is hard to be peeled off from the surface of the base particle.

The average particle diameter of the conductive particles is preferably 0.1 μm or more, and more preferably 100 μm or less, further preferably 50 μm or less because the size is suitable for conductive particles in the conductive material, and the gap between electrodes becomes further small.

The "average particle diameter" of the conductive particles shows a number average particle diameter. The average particle diameter of conductive particles is determined by observing arbitrary 50 conductive particles with an electron microscope or an optical microscope, and calculating an average value.

The resin particles in the conductive particles can be used properly depending on an electrode size or land diameter of a board to be mounted.

For further reliably connecting upper and lower electrodes and further suppressing a short circuit between electrodes adjacent in a lateral direction, an average particle diameter C of conductive particles to an average particle diameter A of resin particles (C/A) is more than 1.0 and preferably 3.0 or less. When the first conductive layer exists between the resin particle and the solder layer, an average particle diameter B of conductive particle parts excluding solder layers to an average particle diameter A of resin particles (B/A) is more than 1.0 and preferably 2.0 or less. Further, when the first conductive layer exists between the resin particle and the solder layer, the average particle diameter C of conductive particles including solder layers to the average particle diameter B of conductive particle parts excluding solder layers (C/B) is more than 1.0 and preferably 2.5 or less. When the ratio (B/A) is falls within the above-mentioned range and the ratio (C/B) falls within the above-mentioned range, upper and lower electrodes are more reliably connected, and a short circuit between electrodes adjacent in a lateral direction is further suppressed.

Anisotropic Conductive Material for FOB and FOF Applications:

The conductive particle is suitably used for connection of a flexible printed circuit board and a glass epoxy board (FOB (Film on Board)) or connection of a flexible printed circuit board and a flexible printed circuit board (FOF (Film on Film)).

In FOB and FOF applications, L&S, which is a dimension of a part where an electrode is present (line) and a part where an electrode is absent (space), is generally 100 to 500 μm. The average particle diameter of resin particles to be used for FOB and FOF applications is preferably 3 to 100 μm. When the average particle diameter of resin particles is 3 μm or more, the thickness of an anisotropic conductive material arranged between electrodes and a connection part becomes sufficiently large, so that adhesive strength is further enhanced. When the average particle diameter of resin particles is 100 μm or less, a short circuit is further hard to occur between adjacent electrodes.

Anisotropic Conductive Material for Flip Chip Applications:

The conductive particle is suitably used for flip chip applications.

In flip chip applications, the land diameter is generally 15 to 80 μm. The average particle diameter of resin particles to be used for flip chip applications is preferably 1 to 15 μm. When the average particle diameter of resin particles is 1 μm or more, the thickness of the solder layer arranged on the surface of the resin particle can be made sufficiently large, so that electrodes can be electrically connected further reliably. When the average particle diameter of resin particles is 15 µm or less, a short circuit is further hard to occur between adjacent electrodes.

Anisotropic Conductive Material for COB and COF:

The conductive particle is suitably used for connection of a semiconductor chip and a glass epoxy board (COB (Chip on Board)) or connection of a semiconductor chip and a flexible printed circuit board (COF (Chip on Film)).

In COB and COF applications, L&S, which is a dimension of a part where an electrode is present (line) and a part where an electrode is absent (space), is generally 10 to 50 µm. The average particle diameter of resin particles to be used for COB and COF applications is preferably 1 to 10 µm. When the average particle diameter of resin particles is 1 µm or more, the thickness of the solder layer arranged on the surface of the resin particle can be made sufficiently large, so that electrodes can be electrically connected further reliably. When the average particle diameter of resin particles is 10 µm or less, a short circuit is further hard to occur between adjacent electrodes.

The surfaces of the conductive particles may be subjected to insulation-treatment with an insulating material, insulating particles, a flux and the like. Preferably, the insulating material, insulating particles, flux and the like are softened and fluidized by heat during connecting to be eliminated in the conductive surface and the connection part. Thus, a short circuit between electrodes is suppressed.

The content of the conductive particles in 100% by weight of the conductive material is preferably 1% by weight or more, more preferably 2% by weight or more, further preferably 3% by weight or more, especially preferably 10% by weight or more, and preferably 50% by weight or less, more preferably 45% by weight or less, further preferably less than 45% by weight, especially preferably 40% by weight or less. When the content of the conductive particles is not less than the above-mentioned lower limit and not more than the above-mentioned upper limit, the conductive particles can be easily arranged between upper and lower electrodes to be connected. Further, adjacent electrodes that must not be connected are hard to be electrically connected through a plurality of conductive particles. That is, a short circuit between adjacent electrodes can be further suppressed.

In the case of FOB and FOF applications, the content of the conductive particles in 100% by weight of the conductive material is preferably 1% by weight or more, more preferably 10% by weight or more, and preferably 50% by weight or less, more preferably 45% by weight or less.

In the case of COB and COF applications, the content of the conductive particles in 100% by weight of the conductive material is preferably 1% by weight or more, more preferably 10% by weight or more, and preferably 50% by weight or less, more preferably 45% by weight or less.

[Binder Resin]

Preferably, the binder resin includes a thermoplastic compound, or includes a curable compound capable of being cured by heating, and a thermal curing agent. Preferably, the binder resin includes a curable compound capable of being cured by heating, and a thermal curing agent.

Examples of the thermoplastic compound include phenoxy resins, urethane resins, (meth)acrylic resins, polyester resins, polyimide resins and polyamide resins.

The curable compound capable of being cured by heating may be a curable compound which is not cured by light irradiation (thermosetting compound), or may be a curable compound capable of being cured by both light irradiation and heating (photocurable and thermosetting compound).

Preferably, the conductive material is a conductive material capable of being cured by both light irradiation and heating, and further includes a curable compound capable of being cured by light irradiation (photocurable compound or photocurable and thermosetting compound). The curable compound capable of being cured by light irradiation may be a curable compound which is not cured by heating (photocurable compound), or may be a curable compound capable of being cured by both light irradiation and heating (photocurable and thermosetting compound). Preferably, the conductive material includes a photocuring initiator. Preferably, the conductive material includes a photoradical generator as the photocuring initiator. Preferably, the conductive material includes a thermosetting compound as the curable compound and further includes a photocurable compound or a photocurable and thermosetting compound. Preferably, the conductive material includes a thermosetting compound and a photocurable compound as the curable compound.

Preferably, the conductive material includes two or more thermal curing agents different in reaction initiation temperature. A thermal curing agent with a reaction initiation temperature at a low-temperature side is preferably a thermal radical generator. A thermal curing agent with a reaction initiation temperature at a high-temperature side is preferably a thermal cation generator.

The curable compound is not particularly limited, and examples thereof include curable compounds having an unsaturated double bond and curable compounds having an epoxy group or a thiirane group.

For enhancing curability of the conductive material and further enhancing conduction reliability between electrodes, the curable compound preferably includes a curable compound having an unsaturated double bond, and preferably includes a curable compound having a (meth)acryloyl group. The unsaturated double bond is preferably a (meth)acryloyl group. Examples of the curable compound having an unsaturated double bond include curable compound having no epoxy group or thiirane group but having an unsaturated double bond, and curable compounds having an epoxy group or thiirane group and having an unsaturated double bond.

As the curable compound having the (meth)acryloyl group, an ester compound obtained by reacting a (meth)acrylic acid with a compound having a hydroxyl group, an epoxy (meth)acrylate obtained by reacting a (meth)acrylic acid with an epoxy compound, an urethane (meth)acrylate obtained by reacting an isocyanate with a (meth)acrylic acid derivative having a hydroxyl group, or the like is suitably used. The "(meth)acryloyl group" shows an acryloyl group and a methacryloyl group. The "(meth)acrylic" means an acrylic and a methacrylic. The "(meth)acrylate" means an acrylate and a methacrylate.

The ester compound obtained by reacting a (meth)acrylic acid with a compound having a hydroxyl group is not particularly limited. As the ester compound, any of a monofunctional ester compound, a difunctional ester compound and tri- or higher functional ester compounds can be used.

For enhancing curability of the conductive material, further enhancing conduction reliability between electrodes and further enhancing adhesive strength of the cured product, the conductive material preferably includes a curable compound having both an unsaturated double bond and a thermosetting functional group. Examples of the thermosetting functional group include an epoxy group, a thiirane group and an oxetanyl group. The curable compound having both an unsaturated double bond and a thermosetting functional group is preferably a curable compound having an epoxy group or a thiirane group and an unsaturated double bond, preferably a curable compound having both a thermosetting functional group and a (meth)acryloyl group, and preferably a curable compound having an epoxy group or a thiirane group and a (meth)acryloyl group.

The curable compound having an epoxy group or a thiirane group and a (meth)acryloyl group is preferably a curable compound obtained by converting some epoxy groups or some thiirane groups of a curable compound having two or more epoxy groups or two or more thiirane groups into (meth)acryloyl groups. Such a curable compound is a partially (meth)acrylated epoxy compound or a partially (meth)acrylated episulfide compound.

The curable compound is preferably a reaction product of a compound having two or more epoxy groups or two or more thiirane groups with a (meth)acrylic acid. This reaction product is obtained by reaction of a compound having two or more epoxy groups or two or more thiirane groups with a (meth)acrylic acid in the presence of a catalyst such as a basic catalyst in accordance with a usual method. Preferably, 20% or more of epoxy groups or thiirane groups is converted into (meth)acryloyl groups (conversion ratio). The conversion ratio is more preferably 30% or more and preferably 80% or less, more preferably 70% or less. Most preferably, 40% or more and 60% or less of epoxy groups or thiirane groups are converted into (meth)acryloyl groups.

Examples of the partially (meth)acrylated epoxy compound include bisphenol type epoxy (meth)acrylates, cresol novolac type epoxy (meth)acrylates, carboxylic acid anhydride-modified epoxy (meth)acrylates and phenol novolac type epoxy (meth)acrylates.

As the curable compound, a modified phenoxy resin formed by converting some epoxy groups or some thiirane groups of a phenoxy resin having two or more epoxy groups or two or more thiirane groups into (meth)acryloyl groups may be used. That is, a modified phenoxy resin having an epoxy group or a thiirane group and a (meth)acryloyl group may be used.

Generally, the "phenoxy resin" is a resin obtained by reaction of, for example, epihalohydrin with a divalent phenol compound, or a resin obtained by reaction of a divalent epoxy compound with a divalent phenol compound.

The curable compound may be a crosslinkable compound or may be a non-crosslinkable compound.

Specific examples of the crosslinkable compound include 1,4-butanediol di(meth)acrylate, 1,6-hexanediol di(meth)acrylate, 1,9-nonanediol di(meth)acrylate, (poly)ethylene glycol di(meth)acrylate, (poly) propylene glycol di(meth)acrylate, neopentylglycol di(meth)acrylate, pentaerythritol di(meth)acrylate, glycerin methacrylate-acrylate, pentaerythritol tri(meth)acrylate, trimethylolpropane trimethacrylate, allyl (meth)acrylate, vinyl (meth)acrylate, divinylbenzene, polyester (meth)acrylate and urethane (meth)acrylate.

Specific examples of the non-crosslinkable compound include ethyl (meth)acrylate, n-propyl (meth)acrylate, isopropyl (meth)acrylate, n-butyl (meth)acrylate, isobutyl (meth)acrylate, t-butyl (meth)acrylate, pentyl (meth)acrylate, hexyl (meth)acrylate, heptyl (meth)acrylate, 2-ethylhexyl (meth)acrylate, n-octyl (meth)acrylate, isooctyl (meth)acrylate, nonyl (meth)acrylate, decyl (meth)acrylate, undecyl (meth)acrylate, dodecyl (meth)acrylate, tridecyl (meth)acrylate and tetradecyl (meth)acrylate.

Further, examples of the curable compound include oxetane compounds, epoxy compounds, episulfide compounds, (meth)acryl compounds, phenol compounds, amino compounds, unsaturated polyester compounds, polyurethane compounds, silicone compounds and polyimide compounds.

For easily controlling curing of the conductive material and further enhancing conduction reliability in the connection structure, the curable compound preferably includes a curable compound having an epoxy group or a thiirane group. The curable compound having an epoxy group is an epoxy compound. The curable compound having a thiirane group is an episulfide compound. For enhancing curability of the conductive material, the content of the compound having an epoxy group or a thiirane group, in 100% by weight of the curable compound, is preferably 10% by weight or more, more preferably 20% by weight or more, and 100% by weight or less. The curable compound having an epoxy group or a thiirane group may constitute the total amount of the above-described curable compound. For improving handling characteristics and further enhancing conduction reliability in the connection structure, the compound having an epoxy group or a thiirane group is preferably an epoxy compound.

Preferably, the conductive material includes a curable compound having an epoxy group or a thiirane group and a curable compound having an unsaturated double bond.

Preferably, the curable compound having an epoxy group or a thiirane group has an aromatic ring. Examples of the aromatic ring include a benzene ring, a naphthalene ring, an anthracene ring, a phenanthrene ring, a tetracene ring, a chrysene ring, a triphenylene ring, a tetraphene ring, a pyrene ring, a pentacene ring, a picene ring and a perylene ring. Particularly, the aromatic ring is preferably a benzene ring, a naphthalene ring or an anthracene ring, and more preferably a benzene ring or a naphthalene ring. The naphthalene ring is preferable because it has a planar structure, so that the conductive material can be further quickly cured.

When a thermosetting compound and a photocurable compound are used in combination, the compounding ratio of the photocurable compound and the thermosetting compound is appropriately adjusted according to types of the photocurable compound and the thermosetting compound. The conductive material includes the photocurable compound and the thermosetting compound at a weight ratio of preferably 1:99 to 90:10, more preferably 5:95 to 60:40, further preferably 10:90 to 40:60.

The conductive material includes a thermal curing agent. The thermal curing agent cures the curable compound capable of being cured by heating. As the thermal curing agent, previously known thermal curing agents can be used. The thermal curing agents may be used alone, or used in combination of two or more thereof.

Examples of the thermal curing agent include imidazole curing agents, amine curing agents, phenol curing agents, polythiol curing agents, thermal cation generators, acid anhydrides and thermal radical generators. Particularly, imidazole curing agents, polythiol curing agents or amine curing agents are preferable because the conductive material can be further quickly cured at low temperature. Latent curing agents are preferable because storage stability is enhanced when a curable compound capable of being cured by heating and the thermal curing agent are mixed. The latent curing agents are preferably latent imidazole curing agents, latent polythiol curing agents or latent amine curing agents. These thermal curing agents may be used alone, or used in combination of two or more thereof. The thermal curing agent may be coated with a polymer substance such as a polyurethane resin or a polyester resin.

The imidazole curing agent is not particularly limited, and examples thereof include 2-methylimidazole, 2-ethyl-4-methylimidazole, 1-cyanoethyl-2-phenylimidazole, 1-cyanoethyl-2-phenylimidazolium trimellitate, 2,4-diamino-6-[2'-methylimidazolyl-(1')]-ethyl-s-triazine and 2,4-diamino-6-[2'-methylimidazolyl-(1')]-ethyl-s-triazine isocyanuric acid adducts.

The polythiol curing agent is not particularly limited, and examples thereof include trimethylolpropane tris-3-mercaptopropionate, pentaerythritol tetrakis-3-mercaptopropionate and dipentaerythritol hexa-3-mercaptopropionate.

The amine curing agent is not particularly limited, and examples thereof include hexamethylenediamine, octamethylenediamine, decamethylenediamine, 3,9-bis(3-aminopropyl)-2,4,8,10-tetraspiro[5.5]undecane, bis(4-aminocyclohexyl)methane, metaphenylenediamine and diaminodiphenyl sulfone.

Examples of the thermal cation generator include iodonium-based cationic curing agents, oxonium-based cationic curing agents and sulfonium-based cationic curing agents. Examples of the iodonium-based cationic curing agent include bis(4-tert-butylphenyl)iodonium hexafluorophosphate. Examples of the oxonium-based cationic curing agent include trimethyloxonium tetrafluoroborate. Examples of the sulfonium-based cationic curing agent include tri-p-tolylsulfonium hexafluorophosphate.

For removing an oxide film formed on the solder surface or the electrode surface to make it easy to form a metal joint with upper and lower electrodes, so that connection reliability is further enhanced, the thermal curing agent preferably includes a thermal cation generator.

The content of the thermal curing agent is not particularly limited. The content of the thermal curing agent is preferably 0.01 parts by weight or more, more preferably 1 part by weight or more, and preferably 200 parts by weight or less, more preferably 100 parts by weight or less, further preferably 75 parts by weight or less based on 100 parts by weight of the curable compound capable of being cured by heating. When the content of the thermal curing agent is not less than the above-mentioned lower limit, the conductive material is easily cured sufficiently. When the content of the thermal curing agent is not more than the above-mentioned upper limit, an excessive thermal curing agent which has not been involved in curing is hard to remain after curing, and heat resistance of the cured product is further enhanced.

When the thermal curing agent includes a thermal cation generator, the content of the thermal cation generator is preferably 0.01 parts by weight or more, more preferably 0.05 parts by weight or more, and preferably 10 parts by weight or less, more preferably 5 parts by weight or less based on 100 parts by weight of the curable compound capable of being cured by heating. When the content of the thermal cation generator is not less than the above-mentioned lower limit and not more than the above-mentioned upper limit, the curable composition is thermally cured sufficiently.

Preferably, the conductive material includes a photocuring initiator. The photocuring initiator is not particularly limited. As the photocuring initiator, previously known photocuring initiators can be used. For further enhancing conduction reliability between electrodes and connection reliability of the connection structure, the conductive material preferably includes a photoradical generator. The photocuring initiators may be used alone, or used in combination of two or more thereof.

The photocuring initiator is not particularly limited, and examples thereof include acetophenone photocuring initiators (acetophenone photoradical generators), benzophenone photocuring initiators (benzophenone photoradical generators), thioxanthone, ketal photocuring initiators (ketal photoradical generators), halogenated ketone, acylphosphine oxide and acylphosphonate.

Specific examples of the acetophenone photocuring initiator include 4-(2-hydroxyethoxy)phenyl(2-hydroxy-2-propyl)ketone, 2-hydroxy-2-methyl-1-phenylpropan-1-one, methoxyacetophenone, 2,2-dimethoxy-1,2-diphenylethan-1-one and 2-hydroxy-2-cyclohexylacetophenone. Specific examples of the ketal photocuring initiator include benzyl dimethyl ketal.

The content of the photocuring initiator is not particularly limited. The content of the photocuring initiator (content of photoradical generator when the photocuring initiator is a photoradical generator) is preferably 0.1 parts by weight or more, more preferably 0.2 parts by weight or more, and preferably 2 parts by weight or less, more preferably 1 part by weight or less based on 100 parts by weight of the curable compound capable of being cured by light irradiation. When the content of the photocuring initiator is not less than the above-mentioned lower limit and not more than the above-mentioned upper limit, the conductive material can be moderately photo-cured. By irradiating the conductive material with light to form B-staged conductive material, flow of the conductive material can be suppressed.

Preferably, the conductive material includes a thermal radical generator. The thermal radical generator is not particularly limited. As the thermal radical generator, previously known thermal radical generators can be used. When the thermal radical generator is used, conduction reliability between electrodes and connection reliability of the connection structure are further enhanced. The thermal radical generators may be used alone, or used in combination of two or more thereof.

The thermal radical generator is not particularly limited, and examples thereof include azo compounds and organic peroxides. Examples of the azo compound include azobisisobutyronitrile (AIBN). Examples of the organic peroxide include di-tert-butyl peroxide and methyl ethyl ketone peroxide.

The content of the thermal radical generator is preferably 0.1 parts by weight or more, more preferably 0.2 parts by weight or more, and preferably 5 parts by weight or less, more preferably 3 parts by weight or less based on 100 parts by weight of the curable compound capable of being cured by heating. When the content of the thermal radical generator is not less than the above-mentioned lower limit and not more than the above-mentioned upper limit, the conductive material can be thermally cured moderately. By making the conductive material in B stage, flow of the conductive material can be suppressed, and occurrence of voids during joining can be also suppressed.

Preferably, the conductive material includes a flux. By using the flux, an oxide film is hard to be formed on the solder surface, and an oxide film formed on the solder surface or the electrode surface can be effectively removed. As a result, conduction reliability in the connection structure is further enhanced. The conductive material may not necessarily include a flux.

The flux is not particularly limited. As the flux, fluxes that are generally used for solder joint can be used. Examples of the flux include zinc chloride, mixtures of zinc chloride and an inorganic halide, mixtures of zinc chloride and an inorganic acid, molten salts, phosphoric acid, derivatives of phosphoric acid, organic halides, hydrazine, organic acids and pine resins. The fluxes may be used alone, or used in combination of two or more thereof.

Examples of the molten salt include ammonium chloride. Examples of the organic acid include lactic acid, citric acid, stearic acid and glutamic acid. Examples of the pine resin include an activated pine resin and a non-activated pine resin. The flux is preferably a pine resin. When the pine resin is used, the connection resistance between electrodes further decreases.

The pine resin is a rosin having abietic acid as a main component. The flux is preferably a rosin, and more preferably abietic acid. When this preferable flux is used, the connection resistance between electrodes further decreases.

The content of the flux in 100% by weight of the conductive material is preferably 0.5% by weight or more, preferably 30% by weight or less, and more preferably 25% by weight or less. When the content of the flux is not less than the above-mentioned lower limit and not more than the above-mentioned upper limit, an oxide film is further hard to be formed on the solder surface, and an oxide film formed on the solder surface or the electrode surface can be further effectively removed. In addition, when the content of the flux is not less than the above-mentioned lower limit, an effect of adding a flux is further effectively exhibited. When the content of the flux is not more than the above-mentioned upper limit, hygroscopicity of the cured product further decreases, so that reliability of the connection structure is further enhanced.

Preferably, the conductive material does not include the flux, or the conductive material includes the flux and the content of the flux in 100% by weight of the conductive material is 25% by weight or less for further suppressing generation of voids in the connection structure. For further suppressing generation of voids in the connection structure, the lower the content of the flux in the conductive material is preferred. For further suppressing generation of voids in the connection structure, the content of the flux in the conductive material is more preferably 15% by weight or less, further preferably 10% by weight or less, especially preferably 5% by weight or less, most preferably 1% by weight or less.

Preferably, the conductive material includes a filler. When the filler is used, the linear thermal expansion coefficient of the cured product of the conductive material decreases. Specific examples of the filler include silica, aluminum nitride, alumina, glass, boron nitride, silicon nitride, silicone, carbon, graphite, graphene and talc. The fillers may be used alone, or used in combination of two or more thereof. When a filler having a high thermal conductivity is used, curing time becomes short.

The conductive material may include a solvent. When the solvent is used, the viscosity of the conductive material can be easily adjusted. Examples of the solvent include ethyl acetate, methylcellosolve, toluene, acetone, methyl ethyl ketone, cyclohexane, n-hexane, tetrahydrofuran and diethyl ether.

(Details and Uses of Conductive Particles and Conductive Material)

The conductive material is preferably an anisotropic conductive material. The conductive material is preferably a paste-like or film-like conductive material, more preferably a paste-like conductive material. The paste-like conductive material is a conductive paste. The film-like conductive material is a conductive film. When the conductive material is a conductive film, a film which does not contain conductive particles may be laminated on a conductive film which contains conductive particles.

The conductive material is preferably a conductive paste, which is applied onto a connection object member in a paste-like state.

The viscosity of the conductive paste at 25° C. is preferably 3 Pa·s or more, more preferably 5 Pa·s or more, and preferably 500 Pa·s or less, more preferably 300 Pa·s or less. When the viscosity is not less than the above-mentioned lower limit, sedimentation of conductive particles in the conductive paste can be suppressed. When the viscosity is not more than the above-mentioned upper limit, dispersibility of conductive particles is further enhanced. When the viscosity of the conductive paste before being applied falls within the above-mentioned range, flow of the conductive paste before curing can be further suppressed after the conductive paste is applied onto the first connection object member, and voids are further hard to occur.

The conductive particle is preferably a conductive particle that is used for connecting a connection object member having a copper electrode. The conductive material is preferably a conductive material that is used for connecting a connection object member having a copper electrode. The surface of a copper electrode is very susceptible to formation of an oxide film. In contrast, a group including a carboxyl group is covalently bonded to the surface of the solder of the conductive particle, and therefore an oxide film on a copper electrode can be effectively removed, so that conduction reliability in the connection structure can be enhanced.

The conductive particle and the conductive material can be used for bonding various connection object members. The conductive material is suitably used for obtaining a connection structure in which first and second connection object members are electrically connected.

Figure 4:
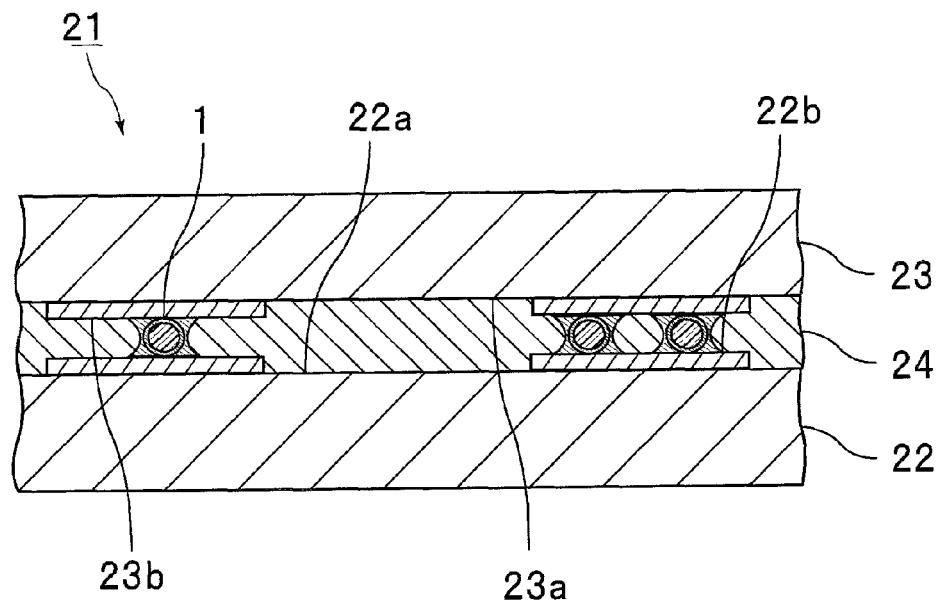
FIG. 4 is a sectional front view schematically showing a connection structure using the conductive particle according to the first embodiment of the present invention.

One example of a connection structure using the conductive particles according to the first embodiment of the present invention is schematically shown in FIG. 4 as a sectional view.

A connection structure 21 shown in FIG. 4 includes a first connection object member 22, a second connection object member 23, and a connection part 24 electrically connecting the first and second connection object members 22 and 23. The connection part 24 is formed of a conductive material (such as an anisotropic conductive material) including conductive particles 1. The connection part 24 may be formed of the conductive particles 1. In this case, the conductive particle 1 itself is the connection part.

The first connection object member 22 has a plurality of first electrodes 22b on a surface 22a. The second connection object member 23 has a plurality of second electrodes 23b on a surface 23a. The first electrode 22b and the second electrode 23b are electrically connected by one or more conductive particles 1. Accordingly, the first and second connection object members 22 and 23 are electrically connected by conductive particles 1.

The method for producing the connection structure is not particularly limited. One example of the method for producing the connection structure is a method in which the conductive material is arranged between the first connection object member and the second object member to obtain a laminated body, followed by heating and pressurizing the laminated body. By heating and pressurization, the solder layer 5 of the conductive particle 1 is melted, and electrodes are electrically connected by the conductive particle 1. Further, when the binder resin includes a thermosetting compound, the binder resin is cured, and the first and second connection object members 22 and 23 are connected by the cured binder resin. The pressure of the pressurization is about 9.8×10⁴ to 4.9×10⁶ Pa. The temperature of the heating is about 120 to 220° C.

Figure 5:
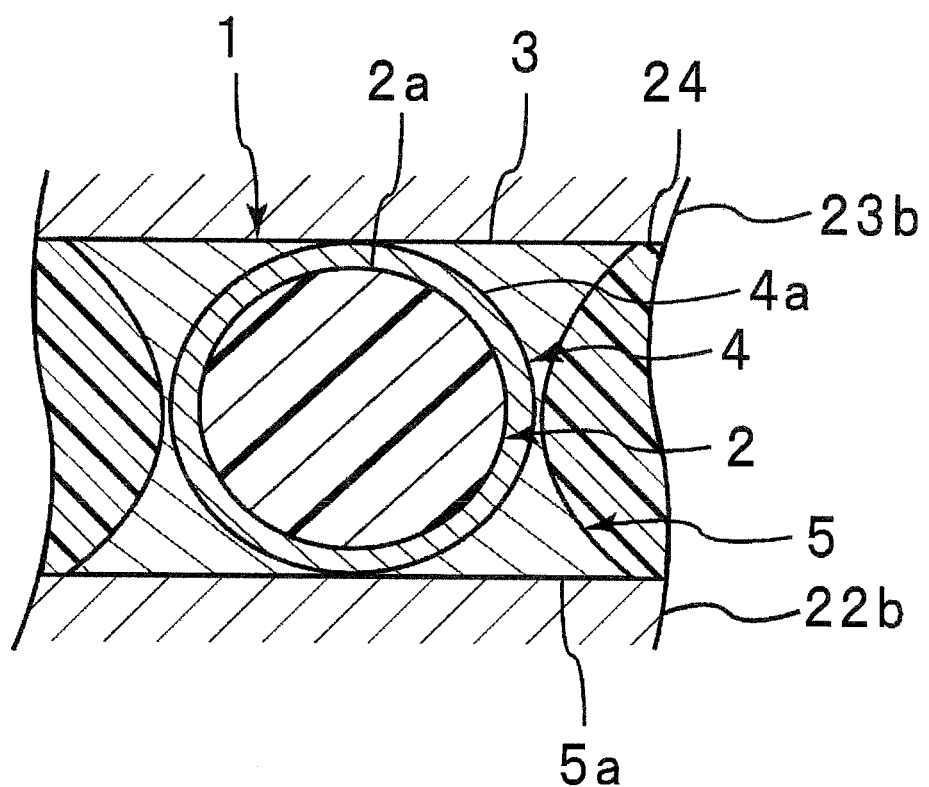
FIG. 5 is a sectional front view schematically showing in an enlarged scale a connection part between a conductive particle and an electrode in the connection structure shown in FIG. 4.

A connection part between the conductive particle 1 and the first and second electrodes 22b and 23b in the connection structure 21 shown in FIG. 4 is shown in an enlarged scale in FIG. 5 as a sectional front view. As shown in FIG. 5, in the connection structure 21, the solder layer 5 of the conductive particle 1 is melted by heating and pressurizing the laminated body, and thereafter a melted solder layer part 5a comes into contact with the first and second electrodes 22b and 23b sufficiently. That is, by using the conductive particle 1 having the solder layer 5 as a surface layer, the contact area of the conductive particle 1 and the electrodes 22b and 23b can be made larger as compared to a case where a conductive particle with the surface layer of a conductive layer formed of a metal such as nickel, gold or copper is used. Therefore, conduction reliability of the connection structure 21 can be enhanced. Generally, heating causes a flux to be gradually deactivated. Further, the first conductive layer 4 can be brought into contact with the first electrode 22b and the second electrode 23b.

The first and second connection object members are not particularly limited. Specific examples of the first and second connection object members include electronic components such as semiconductor chips, capacitors and diodes, and electronic components such as circuit boards such as a printed board, a flexible printed circuit board, a glass epoxy board and a glass board. The conductive material is preferably a conductive material that is used for connecting electronic components. The conductive material is preferably a conductive material which is liquid and is applied to the upper surface of the connection object member in a liquid state.

Examples of the electrode provided on the connection object member include metal electrodes such as a gold electrode, a nickel electrode, a tin electrode, an aluminum electrode, a copper electrode, a molybdenum electrode and a tungsten electrode. When the connection object member is a flexible printed circuit board, the electrode is preferably a gold electrode, a nickel electrode, a tin electrode or a copper electrode. When the connection object member is a glass board, the electrode is preferably an aluminum electrode, a copper electrode, a molybdenum electrode or a tungsten electrode. When the electrode is an aluminum electrode, it may be an electrode formed only of aluminum, or may be an electrode with an aluminum layer laminated on the surface of a metal oxide layer. Examples of the material of the metal oxide layer include indium oxide doped with a trivalent metal element and zinc oxide doped with a trivalent metal element. Examples of the trivalent metal element include Sn, Al and Ga.

Preferably, the first electrode or the second electrode is a copper electrode. Preferably, both the first electrode and the second electrode are copper electrodes.

The present invention will be specifically described below by way of Examples and Comparative Examples. The present invention is not limited to Examples below.

In Examples, Comparative Examples and Reference Examples, the following material were used.

(Binder Resin)

Thermosetting compound 1 (bisphenol A type epoxy compound, "YL980" manufactured by Mitsubishi Chemical Corporation)

Thermosetting compound 2 (epoxy resin ("EXA-4850-150" manufactured by DIC Corporation)

Thermal curing agent A (imidazole compound, "2P-4MZ" manufactured by SHIKOKU CHEMICALS CORPORATION)

Thermal cation generator 1 (compound represented by the following formula (11), compound which releases inorganic acid ions including phosphorus atoms when heated)

[Formula 8]

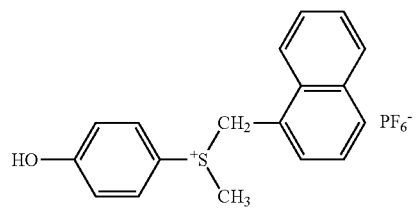

Formula (11)

Thermal cation generator 2 (compound represented by the following formula (12), compound which releases inorganic acid ions including antimony atoms when heated)

[Formula 9]

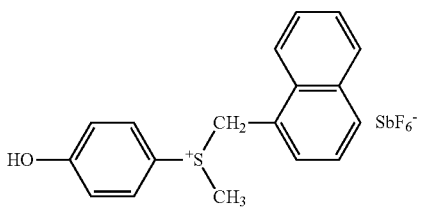

Formula (12)

Thermal cation generator 3 (compound represented by the following formula (13), compound which releases organic acid ions including boron atoms when heated)

[Formula 10]

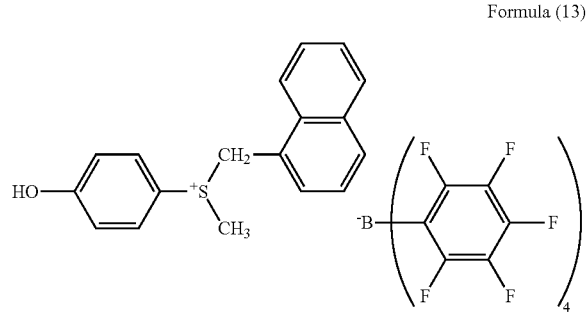

Formula (13)

Thermal radical generator 1 (azobisisobutyronitrile "AIBN" manufactured by Aldrich)

Thermal radical generator 2 (methyl ethyl ketone peroxide, "2-butanone peroxide solution" manufactured by Aldrich)

Adhesion imparting agent: "KBE-403" manufactured by Shin-Etsu Chemical Co., Ltd.

Flux: "Glutaric Acid" manufactured by Wako Pure Chemical Industries, Ltd.

(Conductive Particles)

Conductive particles 1 (resin core solder-coated particles, prepared in the procedure described below)

Divinylbenzene resin particles ("Micropearl SP-210" manufactured by SEKISUI CHEMICAL CO., LTD, average particle diameter: 10 μm, softening point: 330° C., 10% K value (23° C.): 3.8 GPa) were subjected to electroless nickel plating to form base nickel-plated layers each having a thickness of 0.1 μm on the surfaces of the resin particles. Then, the resin particles with base nickel-plated layers formed thereon were subjected to electrolytic copper plating to form copper layers each having a thickness of 1 μm. Further, using an electrolytic plating solution containing tin and bismuth, electrolytic plating was performed to form solder layers each having a thickness of 2 μm. In this way, untreated conductive particles (resin core solder-plated particles having an average particle diameter of 16 μm and a CV value of 20%) were prepared in which copper layers each having a thickness of 1 μm were formed on the surfaces of resin particles and solder layers (tin: bismuth=43% by weight 57% by weight) each having a thickness of 2 μm were formed on the copper layers.

Next, the obtained untreated conductive particles and glutaric acid (compound having two carboxyl groups, "Glutaric Acid" manufactured by Wako Pure Chemical Industries, Ltd.) were stirred while being dehydrated in a toluene solvent at 90° C. for 8 hours using p-toluenesulfonic acid as a catalyst to obtain conductive particles in which a group including a carboxyl acid was covalently bonded to the surface of the solder. The conductive particles are called conductive particles 1.

Further, conductive particles 2 and 3 described below in which a group including a carboxyl acid was covalently bonded to the surface of a solder were obtained in the same manner as that for the conductive particles 1 except that the thicknesses of the copper layer and the solder layer were changed as described below, and the type of the compound X was changed to a compound described below.

Conductive particles 2 (divinylbenzene resin particles, average particle diameter of resin particles: 10 μm 10% K value (23° C.) of resin particles: 3.8 GPa, softening point of resin particles: 330° C., thickness of copper layer: 3 gra, thickness of solder layer: 4 μm, average particle diameter of conductive particles: 24 μm, CV value: 20%, using glutaric acid (compound having two carboxyl groups, "Glutaric Acid" manufactured by Wako Pure Chemical Industries, Ltd.)

Conductive particles 3 (divinylbenzene resin particles, average particle diameter of resin particles: 10 μm, 10% K value (23° C.) of resin particles: 3.8 GPa, softening point of resin particles: 330° C., thickness of copper layer: 3 μm, thickness of solder layer: 4 μm, average particle diameter of conductive particles: 24 μm, CV value: 20%, using glycolic acid (compound having one hydroxyl group and one carboxyl group, "Glycolic Acid" manufactured by Tokyo Chemical Industry Co., Ltd.)

Conductive Particles A: SnBi solder particles ("DS-10" manufactured by MITSUI MINING & SMELTING CO., LTD., average particle diameter (median diameter): 12 μm)

Conductive Particles B: untreated conductive particles not treated with the compound X in preparation of conductive particles 1

EXAMPLES 1 TO 16 AND COMPARATIVE EXAMPLES 1 TO 3

Components shown in Tables 1 and 2 below were compounded in compounding amounts shown in Tables 1 and 2 to obtain an anisotropic conductive paste. In Comparative Examples 1 to 3, a conductive particle and a flux were chelate-coordinated.

(Evaluation)

(1) Preparation of Connection Structure A

A glass epoxy board (FR-4 board) having on the upper surface a copper electrode pattern (copper electrode thickness: 10 μm) having a L/S of 100 μm/100 μm was provided. Further, a flexible printed circuit board having on the lower surface a copper electrode pattern (copper electrode thickness: 10 μm) having a L/S of 100 μm/100 μm was provided.

A superimposed area of the glass epoxy board and the flexible board was 1.5 cm×4 mm, and the number of connected electrodes was 75 pairs.

The anisotropic conductive paste immediately after being prepared was applied in a thickness of 50 μm to the upper surface of the glass epoxy board to form an anisotropic conductive paste layer. At this time, solvent drying was performed for anisotropic conductive pastes containing a solvent. Next, the flexible printed circuit board was laminated to the upper surface of the anisotropic conductive paste layer such that electrodes faced each other. Thereafter, a pressurizing and heating head was placed on the upper surface of the semiconductor chip while the temperature of the head was adjusted so that the anisotropic conductive paste layer had a temperature of 185° C., and a pressure of 2.0 MPa was applied to melt the solder, and the anisotropic conductive paste layer was cured at 185° C. to obtain a connection structure A.

(2) Preparation of Connection Structure B

The glass epoxy board provided in connection with the connection structure A was exposed at 230° C. for 40 seconds or more to oxidize the copper electrode. A connection structure B was obtained in the same manner as that for the connection structure A except that a glass epoxy board after oxidization was used.

(3) Conduction Test a Between Upper and Lower Electrodes

Connection resistances between upper and lower electrodes of the obtained connection structure A were each measured by a four-terminal method. An average of two connection resistances was calculated. From the relationship of voltage=current×resistance, a connection resistance can be determined by measuring a voltage at the time of passing a constant current. Assessment was performed on the conduction test A in accordance with the criteria described below.

[Assessment Criteria for Conduction Test A]

◯◯: The average of connection resistances is not more than 8.0Ω

◯: The average of connection resistances is more than 8.0Ω and not more than 10.0Ω

Δ: The average of connection resistances is more than 10.0Ω and not more than 15.0Ω x: The average of connection resistances is more than 15.0Ω

(4) Conduction Test B Between Upper and Lower Electrodes

Connection resistances between upper and lower electrodes of the obtained connection structure B were each measured by a four-terminal method. An average of two connection resistances was calculated. From the relationship of voltage=current×resistance, a connection resistance can be determined by measuring a voltage at the time of passing a constant current. Assessment was performed on the conduction test B in accordance with the criteria described below. In the connection structure B, the connection resistance tends to easily increase because there is a larger amount of an oxide on the electrode as compared to the connection structure A. That is, the conduction test B is severer than the conduction test A.

[Assessment Criteria for Conduction Test B]

○○: The average of connection resistances is not more than 8.0Ω

○: The average of connection resistances is more than 8.0Ω and not more than 10.0Ω

Δ: The average of connection resistances is more than 10.0Ω and not more than 15.0Ω x: The average of connection resistances is more than 15.0Ω

(5) Presence/Absence of Voids A

Whether or not the cured material layer formed from the anisotropic conductive paste layer had voids in the obtained connection structure A was checked by visual observation from the lower surface side of the transparent glass board. Assessment was performed on the presence/absence of voids A in accordance with the criteria described below.

[Assessment Criteria for Presence/Absence of Voids]

○○: No void is present.

○: Only one small void is present.

Δ: Two or more small voids are present.

x: A large void is present to cause a problem in practical use.

(6) Presence/Absence of Voids B

Whether or not the cured material layer formed from the anisotropic conductive paste layer had voids in the obtained connection structure B was checked by visual observation from the lower surface side of the transparent glass board. Assessment was performed on the presence/absence of voids B in accordance with the criteria described below. In the connection structure B, voids tend to be easily generated because there is a larger amount of an oxide on the electrode as compared to the connection structure A. That is, evaluation for presence/absence of voids A is severer than evaluation for presence/absence of voids B.

[Assessment Criteria for Presence/Absence of Voids B]

○○: No void is present.

○: Only one small void is present.

Δ: Two or more small voids are present.

x: A large void is present to cause a problem in practical use.

The results are shown in Tables 1 and 2 below.

TABLE 1

| | | Ex. 1 | Ex. 2 | Ex. 3 | Ex. 4 | Ex. 5 | Ex. 6 | Ex. 7 | Ex. 8 | Comp. Ex. 1 | Comp. Ex. 2 | Comp. Ex. 3 |
|---|---|---|---|---|---|---|---|---|---|---|---|---|
| Compounded components (parts by weight) | Thermosetting compound 1 | 30 | 30 | 30 | 30 | 30 | 30 | 30 | 30 | 30 | 30 | 30 |
| | Thermosetting compound 2 | 70 | 70 | 70 | 70 | 70 | 70 | 70 | 70 | 70 | 70 | 70 |
| | Thermal curing agent A | 5 | 5 | 5 | | | | | | 5 | 5 | 5 |
| | Thermal cation generator 1 | | | | 2 | | | | | | | |
| | Thermal cation generator 2 | | | | | 2 | | | | | | |
| | Thermal cation generator 3 | | | | | | 2 | | | | | |
| | Thermal radical generator 1 | | | | | | | 1 | | | | |
| | Thermal radical generator 2 | | | | | | | | 1 | | | |
| | Adhesion imparting agent | 2 | 2 | 2 | 2 | 2 | 2 | 2 | 2 | 2 | 2 | 2 |
| | Flux | | | | | | | | | 1 | 25 | 25 |
| | Conductive particle 1 | 45 | | | 45 | 45 | 45 | 45 | 45 | | | |
| | Conductive particle 2 | | 45 | | | | | | | | | |
| | Conductive particle 3 | | | 45 | | | | | | | | |
| | Conductive particle A | | | | | | | | | 45 | 45 | |
| | Conductive particle B | | | | | | | | | | | 45 |
| Evaluation | Conduction test A | ○○ | ○○ | ○○ | ○○ | ○○ | ○○ | ○○ | ○○ | ○ | ○○ | Δ |
| | Conduction test B | ○ | ○ | ○ | ○○ | ○○ | ○○ | ○○ | ○○ | ○ | ○○ | Δ |
| | Presence/absence of voids A | ○○ | ○○ | ○○ | ○○ | ○○ | ○○ | ○ | ○ | Δ | x | Δ |
| | Presence/absence of voids B | ○ | ○ | ○ | ○○ | ○○ | ○○ | ○○ | ○○ | x | x | x |

TABLE 2

| | | Ex. 9 | Ex. 10 | Ex. 11 | Ex. 12 | Ex. 13 | Ex. 14 | Ex. 15 | Ex. 16 |
|---|---|---|---|---|---|---|---|---|---|
| Compounded components (parts by weight) | Thermosetting compound 1 | 30 | 30 | 30 | 30 | 30 | 30 | 30 | 30 |
| | Thermosetting compound 2 | 70 | 70 | 70 | 70 | 70 | 70 | 70 | 70 |
| | Thermal curing agent A | 5 | 5 | 5 | 5 | 5 | 5 | 5 | 5 |
| | Thermal cation generator 1 | | | | | | | | |
| | Thermal cation generator 2 | | | | | | | | |
| | Thermal cation generator 3 | | | | | | | | |
| | Thermal radical generator 1 | | | | | | | | |
| | Thermal radical generator 2 | | | | | | | | |
| | Adhesion imparting agent | 2 | 2 | 2 | 2 | 2 | 2 | 2 | 2 |
| | Flux | | | | | | | | |
| | Conductive particle 1 | 35 | 5 | 1 | 0.5 | 50 | 55 | | |
| | Conductive particle 2 | | | | | | | 35 | |
| | Conductive particle 3 | | | | | | | | 35 |
| | Conductive particle A | | | | | | | | |
| | Conductive particle B | | | | | | | | |
| Evaluation | Conduction test A | ○○ | ○○ | ○○ | ○ | ○○ | ○○ | ○○ | ○○ |
| | Conduction test B | ○○ | ○○ | ○ | Δ | ○ | Δ | ○○ | ○○ |
| | Presence/absence of voids A | ○○ | ○○ | ○○ | ○○ | ○○ | ○○ | ○○ | ○○ |
| | Presence/absence of voids B | ○○ | ○○ | ○ | Δ | ○ | Δ | ○○ | ○○ |

EXPLANATION OF SYMBOLS

1: Conductive particle
1a: Surface
2: Resin particle
2a: Surface
3: Conductive layer
4: First conductive layer
4a: Surface
5: Solder layer
5a: Melted solder layer part
11: Conductive particle
12: Solder layer
16: Conductive particle
21: Connection structure
22: First connection object member
22a: Surface
22b: First electrode
23: Second connection object member
23a: Surface
23b: Second electrode
24: Connection part

The invention claimed is:

1. A conductive particle having a solder at a conductive surface,
the conductive particle being obtained by using a compound having a functional group capable of reacting with a hydroxyl group and having a carboxyl group and by allowing a hydroxyl group of the solder itself on the surface of the solder to react with the functional group capable of reacting with a hydroxyl group,
wherein a group including a carboxyl group is covalently bonded to the surface of the solder via an ether bond or an ester bond, and
the carboxyl group of the group including a carboxyl group is present on the surface of the solder.

2. The conductive particle according to claim 1,
wherein the functional group capable of reacting with a hydroxyl group is a hydroxyl group or a carboxyl group, and
when the functional group capable of reacting with a hydroxyl group is a carboxyl group, the compound has at least two carboxyl groups.

3. The conductive particle according to claim 1,
wherein conductive particle comprises a base particle; and a solder layer arranged on the surface of the base particle, and
the conductive particle has the solder derived from the solder layer at the conductive surface.

4. The conductive particle according to claim 3,
wherein the conductive particle further comprises a first conductive layer arranged between the base particle and the solder layer, and
the solder layer is arranged on the outer surface of the first conductive layer.

5. The conductive particle according to claim 1,
wherein the conductive particle is dispersed in a binder resin, and used as a conductive material.

6. A method for producing conductive particles, comprising a step of:
using conductive particles each having a solder at a conductive surface and mixing the conductive particles, a compound having a functional group capable of reacting with a hydroxyl group and having a carboxyl group, a catalyst and a solvent to allow a hydroxyl group of the solder itself on the surface of the solder to react with the functional group capable of reacting with a hydroxyl group and form conductive particles in which a group including a carboxyl group is covalently bonded to the surface of the solder via an ether bond or an ester bond, and the carboxyl group of the group including a carboxyl group is present on the surface of the solder.

7. The method for producing conductive particles according to claim 6,
wherein conductive particles each having a solder at a conductive surface are used, and
the conductive particles, the compound having a. functional group capable of reacting with a hydroxyl group and having a carboxyl group, the catalyst and the solvent are mixed and heated.

8. A conductive material comprising the conductive particle according to claim 1, and a binder resin.

9. The conductive material according to claim 8, which is an anisotropic conductive material,
wherein the content of the conductive particles in 100% by weight of the anisotropic conductive material is not less than 1% by weight and not more than 50% by weight.

10. A connection structure comprising:
a first connection object member having a first electrode on a surface;
a second connection object member having a second electrode on a surface; and
a connection part connecting the first connection object member and the second connection object member,
wherein the connection part is formed of the conductive particles according to claim 1 or formed of the conductive material including the conductive particles and a binder resin, and
the first electrode and the second electrode are electrically connected by the conductive particles.

* * * * *